(12) United States Patent
Jaksic et al.

(10) Patent No.: US 10,717,366 B1
(45) Date of Patent: Jul. 21, 2020

(54) HIGH-FREQUENCY DIRECT CURRENT BULK CAPACITORS WITH INTERLEAVED BUSBAR PACKAGES

(71) Applicant: GM Global Technology Operations LLC, Detroit, MI (US)

(72) Inventors: Marko Jaksic, Shelby Township, MI (US); Constantin C. Stancu, Torrance, CA (US); Dawud S. Abu-Zama, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 16/405,491

(22) Filed: May 7, 2019

(51) Int. Cl.
| | |
|---|---|
| *B60L 50/40* | (2019.01) |
| *H02M 7/00* | (2006.01) |
| *H05K 7/14* | (2006.01) |
| *B60M 1/30* | (2006.01) |
| *B60L 15/00* | (2006.01) |
| *B60L 50/61* | (2019.01) |

(52) U.S. Cl.
CPC ............ *B60L 50/40* (2019.02); *B60L 15/007* (2013.01); *B60L 50/61* (2019.02); *B60M 1/30* (2013.01); *H02M 7/003* (2013.01); *H05K 7/1432* (2013.01)

(58) Field of Classification Search
CPC ............ H05K 7/1432; H05K 7/20845–20881; H02M 7/003
See application file for complete search history.

(56) References Cited

U.S. PATENT DOCUMENTS

| | | | |
|---|---|---|---|
| 6,275,004 B1 | 8/2001 | Tamai et al. | |
| 6,362,585 B1 | 3/2002 | Hiti et al. | |
| 7,675,192 B2 | 3/2010 | Tang et al. | |
| 7,755,313 B2 | 7/2010 | Son et al. | |
| 7,798,833 B2* | 9/2010 | Holbrook | B60R 25/00 439/212 |
| 7,907,385 B2* | 3/2011 | Korich | H01G 2/04 361/305 |
| 8,102,678 B2 | 1/2012 | Jungreis | |
| 8,193,449 B2* | 6/2012 | Esmaili | H05K 7/1432 174/70 B |
| 8,416,556 B2* | 4/2013 | Grimm | H01G 4/224 361/301.1 |

(Continued)

*Primary Examiner* — Robert J Hoffberg
(74) *Attorney, Agent, or Firm* — Quinn IP Law

(57) ABSTRACT

Presented are electrical capacitors with interleaved busbar architectures, methods for making/operating such capacitors, and electric-drive vehicles equipped with such capacitors. A bulk capacitor includes multiple capacitor devices disposed within an outer housing and operable to modify electric current transmitted between a power source and an electrical load. An interleaved busbar package is interposed between the capacitor devices and outer housing. The interleaved busbar package includes a first busbar plate that electrically connects to first terminals of the capacitor devices and defines a busbar pocket. A second busbar plate is seated within the busbar pocket and electrically connects to second terminals of the capacitor devices. The second busbar plate includes a capacitor basin that seats therein the capacitor devices. An isolator sheet is interleaved between and electrically insulates the first and second busbar plates. The capacitor devices and interleaved busbar package may be partially submerged in an epoxy endfill composition.

20 Claims, 5 Drawing Sheets

(56) References Cited

U.S. PATENT DOCUMENTS

| | | | |
|---|---|---|---|
| 8,480,419 B2 * | 7/2013 | Holbrook | H05K 7/1432 |
| | | | 439/213 |
| 8,565,949 B2 | 10/2013 | Christman et al. | |
| 9,142,980 B2 | 9/2015 | Lee | |
| 9,573,474 B2 | 2/2017 | Mensah-Brown et al. | |
| 9,660,462 B2 | 5/2017 | Jeon | |
| 9,853,589 B2 | 12/2017 | Jing | |
| 10,147,920 B2 * | 12/2018 | Le Gall | H01M 10/653 |
| 10,177,675 B2 * | 1/2019 | Numakura | H02M 7/003 |
| 2008/0284385 A1 | 11/2008 | Namuduri et al. | |
| 2011/0215767 A1 | 9/2011 | Johnson et al. | |
| 2011/0248675 A1 | 10/2011 | Shiu et al. | |
| 2012/0181854 A1 | 7/2012 | Gopalakrishnan et al. | |
| 2012/0206296 A1 | 8/2012 | Wan | |
| 2013/0119935 A1 | 5/2013 | Sufrin-Disler et al. | |
| 2013/0127399 A1 | 5/2013 | Tang et al. | |
| 2014/0152232 A1 | 6/2014 | Johnson et al. | |
| 2019/0378658 A1 * | 12/2019 | Hiramoto | H01G 4/012 |

* cited by examiner

HIGH-FREQUENCY DIRECT CURRENT BULK CAPACITORS WITH INTERLEAVED BUSBAR PACKAGES

STATEMENT REGARDING FEDERALLY SPONSORED RESEARCH AND DEVELOPMENT

This invention was made with government support under Contract No. DE-EE-0007285 awarded by the U.S. Department of Energy (DOE); the government has certain rights in the invention.

INTRODUCTION

The present disclosure relates generally to high-voltage electric power systems. More specifically, aspects of this disclosure relate to high-frequency, direct current (DC) bulk capacitors for hybrid and electric ("electric-drive") motor vehicles.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving power through an automatic or manually shifted power transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, and rotary engines, as some non-limiting examples. Hybrid and full electric vehicles, on the other hand, utilize alternative power sources to propel the vehicle and, thus, minimize or eliminate reliance on a fossil-fuel based engine for tractive power.

A full electric vehicle (FEV)—colloquially referred to as an "electric car"—is a type of electric-drive vehicle configuration that altogether removes the internal combustion engine and attendant peripheral components from the powertrain system, relying solely on electric traction motors for propulsion and for supporting accessory loads. The engine, fuel supply system, and exhaust system of an ICE-based vehicle are replaced with an electric motor, a traction battery back, and battery cooling and charging electronics in an FEV. Hybrid vehicle powertrains, in contrast, employ multiple sources of tractive power to propel the vehicle, most commonly operating an internal combustion engine assembly in conjunction with a battery-powered or fuel-cell-powered electric traction motor. Since hybrid vehicles are able to derive their power from sources other than the engine, hybrid electric vehicle (HEV) engines may be turned off, in whole or in part, while the vehicle is propelled by the electric motor(s).

Most commercially available hybrid and electric vehicles employ a rechargeable traction battery pack (also referred to as "electric-vehicle battery" or "EVB") to store and supply the requisite power for operating the powertrain's motor/generator unit(s). A traction battery pack, which is significantly larger, more powerful, and higher in capacity than a 12-volt starting, lighting, and ignition (SLI) battery, groups stacks of battery cells into individual battery modules that are mounted onto the vehicle chassis, e.g., via a battery housing or support tray. Some vehicle battery systems employ multiple independently-operable, high-voltage battery packs to provide higher voltage delivery and greater system capacity through increased amp-hours. A dedicated Battery Pack Control Module (BPCM) regulates the opening and closing of battery pack contactors to govern which pack or packs will power the vehicle's traction motor(s) at a given time. While the vehicle is in operation, the battery system may switch from one pack to another in a manner that protects the battery packs and contactors while ensuring a constant feed of voltage so as to not interfere with powertrain functionality.

High-voltage electric power systems govern the transfer of electricity between the traction motor(s) and battery pack(s) of electric-drive vehicles. The electric circuit may employ a front-end DC-to-DC electric power converter that is electrically connected to the vehicle's traction battery pack(s) in order to increase the supply of voltage to a high-voltage main DC bus and an electronic power inverter. A high-frequency bulk capacitor may be arranged across the positive and negative terminals of the main DC bus to provide electrical stability and store supplemental electric energy. Bulk capacitor size—in terms of total capacitance—may be selected based upon expected DC bus voltage range, peak current and ripple voltage when operating the inverter employing, for example, a six-step mode of operation. Operation and control of multi-phase electric motor/generator units, such as permanent magnet synchronous traction motors, may be accomplished by employing the inverter to transform DC electric power to alternating current (AC) power using pulse-width modulated control signals output from a resident controller.

SUMMARY

Disclosed herein are electrical capacitors with interleaved busbar architectures, methods for making and methods for operating such capacitors, high-voltage electric power circuits using such capacitors, and electric-drive vehicles equipped with such capacitors. By way of example, and not limitation, there are presented high-frequency DC bulk capacitors with interleaved busbar packages for reduced parasitic inductance, improved current sharing symmetry, and increased switching frequency capabilities. The interleaved busbar package includes two electrically conductive busbar plates fabricated with complementary U-shaped geometries that enable one busbar to nest within the other busbar. A similarly U-shaped electrical insulator, which may be in the nature of an aramid paper or a polyester or epoxy-glass sheet, is sandwiched between the superposed busbar conductors. Once assembled, the interleaved busbar package forms a basin that seats therein a stack of capacitor bobbins, which may be arrayed in juxtaposed columns of bobbin pairs. The array of capacitor bobbins may be wrapped in an electrically insulating jacket, with discrete insulation endcaps placed on distal ends of each bobbin. After seating the insulated bobbins within the busbar package, the subassembly may be mounted inside a capacitor housing while concomitantly submerged within an epoxy endfill composition, e.g., in a "wrap & fill" configuration. Terminal tabs at distal ends of the busbar conductors may be electrically connected, e.g., via laser welding, to a power inverter module (PIM).

Attendant benefits for at least some of the disclosed DC bulk capacitor architectures include minimized total power stage inductance (e.g., a five-time reduction over comparable packaging solutions). In addition to a measurable reduction in parasitic inductance, disclosed capacitor designs enable utilization of wide bandgap devices at increased slew rate speeds and thereby reduce power losses of traction inverters. Other attendant benefits may include improved bulk capacitor packaging that reduces the overall size, weight, and cost of a traction inverter. Disclosed systems, methods, and devices may also enable equal current sharing among the capacitor bobbins to provision the symmetric distribution of current stresses. Proposed capacitor packages may also enable operation of the power inverter module at high switching frequencies and slew rates such that the module may be used for boost converter applications. Laser welding of the DC bulk capacitor to a power inverter module provisions a low resistance and low inductance connection between the two components. An interleaved busbar package, as disclosed herein, may be modular and, thus, can be scaled to accommodate different numbers of capacitor bobbins. For automotive applications, it is envisioned that use of disclosed DC bulk capacitor designs will help to effectively increase the "miles per gallon" rating of electric-drive vehicles.

Aspects of this disclosure are directed to high-frequency DC bulk capacitors with interleaved busbar packages, e.g., for filtering current flow across a high-voltage main DC bus. In an example, a bulk capacitor is presented that includes an outer housing within which is stored multiple capacitor devices, such as side-by-side stacks of wound film capacitors. These capacitor devices cooperatively modify electric currents transmitted back-and-forth between a power source, such as a traction battery pack, and an electrical load, such as a traction motor. An interleaved busbar package is interposed between and separates the capacitor devices and outer housing. The interleaved busbar package includes a first (negative) busbar plate that electrically connects to first (negative) terminals of the capacitor devices. A second (positive) busbar plate, which is seated within a busbar pocket formed into the first busbar plate, electrically connects to second (positive) terminals of the capacitor devices. The second busbar plate is formed with a capacitor basin that seats therein and partially surrounds the capacitor devices. An isolator sheet is interleaved between the two busbar plates to electrically insulate the first busbar plate from the second busbar plate.

Additional aspects of this disclosure are directed to electric-drive vehicles and electrified vehicle powertrains equipped with high-frequency DC bulk capacitors with interleaved busbar packages. As used herein, the term "motor vehicle" may include any relevant vehicle platform, such as passenger vehicles (ICE, REV, FEV, fuel cell, fully and partially autonomous, etc.), commercial vehicles, industrial vehicles, tracked vehicles, off-road and all-terrain vehicles (ATV), motorcycles, farm equipment, watercraft, aircraft, etc. In an example, an electric-drive vehicle includes a vehicle body with multiple road wheels and other standard original equipment. Mounted on the vehicle body is one or more electric traction motors that selectively drive one or more of the road wheels to thereby propel the vehicle. Also mounted on the vehicle body is one or more rechargeable traction battery packs that selectively store and transmit electric current to power the traction motor(s). The battery pack(s) and motor(s) may be interconnected via a high-voltage electric circuit.

Continuing with the above example, the vehicle's energy storage system also includes a bulk capacitor with an electrically insulating outer housing that is mounted onto the vehicle body. An array of stacked capacitor devices is packaged within the outer housing and operable to filter or otherwise modify electric currents transmitted between the traction battery pack(s) and traction motor(s). An interleaved busbar package is placed between and separates the capacitor devices and outer housing. The interleaved busbar package includes a first (negative) busbar plate with a busbar pocket that seats therein a second (positive) busbar plate. The first busbar plate is electrically connected to first (negative) terminals of the capacitor devices, whereas the second busbar plate is electrically connected to second (positive) terminals of the capacitor devices. The second busbar plate has a capacitor basin that seats therein and partially surrounds the arrayed capacitor devices. An isolator sheet is interleaved between the two busbar plates to electrically insulate the first busbar plate from the second busbar plate.

Other aspects of the disclosure are directed to methods for making and methods for using any of the disclosed capacitor assemblies, electrical systems, powertrains, and vehicles. In an example, a method is presented for assembling a bulk capacitor. This representative method includes, in any order and in any combination with any of the above and below disclosed options and features: placing a plurality of capacitor devices within an outer housing, the capacitor devices being operable to modify an electric current transmitted between a power source and an electrical load; and positioning an interleaved busbar package between the outer housing and capacitor devices, the positioning of the busbar package including: electrically connecting a first busbar plate to first terminals of the capacitor devices, the first busbar plate defining a busbar pocket; electrically connecting a second busbar plate to second terminals of the capacitor devices, the second busbar plate being seated within the busbar pocket and defining a capacitor basin seating therein the capacitor devices; and interleaving an isolator sheet between the busbar plates to thereby electrically insulate the first busbar plate from the second busbar plate.

For any of the disclosed systems, methods, and devices, each busbar plate may have a U-shaped cross-section with the second busbar plate's U-shaped cross-section being slightly narrower than the first busbar plate's U-shaped cross-section. With this configuration, the first and second busbar plates may nest substantially coterminous with each other such that sidewalls of the two busbar plates are mutually parallel, while bases of the two busbar plates are substantially parallel with one another. In the same vein, the isolator sheet may have a respective U-shaped cross-section that is narrower than the first busbar plate's U-shaped cross-section yet wider than the second busbar plate's U-shaped cross-section. With this configuration, the isolator sheet's base lays substantially flush against both bases of the first and second busbar plates, and the isolator sheet's sidewalls lay substantially flush against respective sidewalls of the two busbar plates.

For any of the disclosed systems, methods, and devices, each busbar plate may have a pair of sidewalls that adjoin and project substantially orthogonally from a base. As a further option, each busbar plate sidewall may be fabricated with multiple windows that extend through the sidewall. Each of these windows is aligned with a longitudinal end of a capacitor device. Electrical fingers may project into some, but not all, of the busbar plate windows; these fingers electrically connect to the terminals of the capacitor devices. In addition, each busbar plate may be fabricated with a connector pad that projects transversely from one sidewall and electrically connects to the electrical load. A connector tab may project from the other sidewall and electrically connect to the power source. As yet a further option, the isolator sheet may have a pair of sidewalls that adjoin and project substantially orthogonally from a base. An optional pad isolator projects from one of the isolator sheet's sidewalls and interleaves between the connector pads of the two busbar plates. A tab isolator may project from the other isolator sheet sidewall and interpose between the connector tabs of the busbar plates. A lining jacket may be wrapped around and electrically insulate an outer perimeter of the capacitor array.

The above summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

Figure 1:
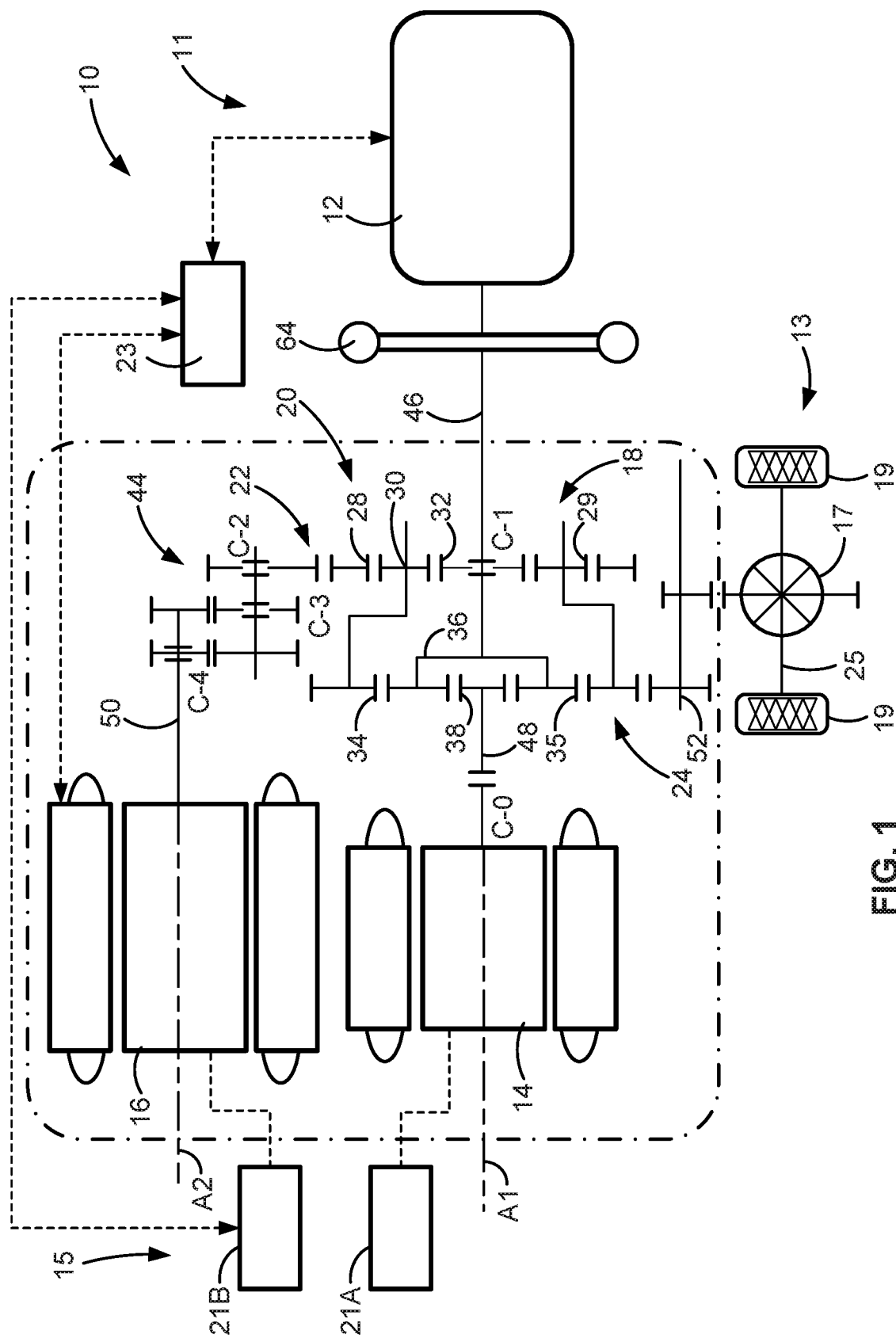
FIG. 1 is a schematic diagram illustrating a representative power-split hybrid powertrain architecture of an electric-drive motor vehicle with a DC bulk capacitor in accordance with aspects of the present disclosure.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle when the vehicle is operatively oriented on a normal driving surface.

Referring now to the drawings, wherein like reference numbers refer to like features throughout the several views, there is shown in FIG. 1 a schematic illustration of a representative automobile, which is designated generally at 10 and portrayed herein for purposes of discussion as a hybrid electric vehicle. In accord with a more specific, non-limiting example, the powertrain 11 is a dual-mode, power-split hybrid electric powertrain with a variable-displacement 6.0-liter V8 engine 12 and two 60-kilowatt multiphase brushless permanent magnet (PM) motors 14 and 16 that are mounted to a multi-speed electrically variable transmission (EVT) 18. The illustrated automobile 10—also referred to herein as "motor vehicle" or "vehicle" for short—is merely an exemplary application with which novel aspects and features of this disclosure can be practiced. Additionally, implementation of the present concepts into a dual-mode, power-split hybrid electric powertrain should also be appreciated as an exemplary application of the novel concepts disclosed herein. As such, it will be understood that aspects and features of the disclosure can be applied to other powertrain configurations, utilized for any logically relevant type of motor vehicle, and implemented in automotive and non-automotive applications alike. Lastly, only select components have been shown and will be described in additional detail herein. Nevertheless, the vehicles, systems and devices discussed below can include numerous additional and alternative features, and other commercially available peripheral components, e.g., for carrying out the various methods and functions of this disclosure.

The hybrid powertrain 11 of FIG. 1 may be designed to launch and propel the vehicle 10, to operate the vehicle in all speed ranges between low and high road speeds, and to power any or all of the onboard vehicle electronics. An "electrically variable transmission," as shown in the drawings, comprises a transmission planetary gear train operatively connected to each of the engine 12, the first motor/generator unit (MGU) 14, and the second MGU 16. Channeling respective torques of the engine 12 and the two motor/generator units 14, 16 (referred to interchangeably as "traction motors") to different members of the planetary gear train permits one of the power sources to either assist or balance the operation of any of the other two power sources. Thus, the combination of an engine 12 and multiple motor/generator units 14, 16 operatively connected to the EVT 18 allows speeds and torques of the engine and motor/generators to be controlled and selected independently in order to power a subject vehicle 10 more efficiently.

The vehicle 10 is equipped with a vehicle battery system 15 that may comprise, for example, multiple battery cells packaged as battery modules that are stacked into multiple traction battery packs 21A and 21B. These battery cells may utilize any suitable battery technology, including, for example, lead-acid, nickel-metal hydride (NiMH), lithium-ion ("Li-Ion"), Li-Ion polymer, zinc-air, lithium-air, nickel-cadmium (NiCad), valve-regulated lead-acid ("VRLA"), including absorbed glass mat ("AGM"), nickel-zinc (NiZn), molten salt (e.g., a Na—$NiCl_2$ battery), or any combination thereof. Each battery pack or each battery cell may be associated with one or more sensors to measure one or more battery characteristics (e.g., voltage, current, temperature, SOC, capacity, etc.) associated with each pack/cell. The vehicle battery system 15 is operatively connected to the motor/generators units 14, 16 to transfer electrical current to and receive electrical current from these MGUs.

Resident vehicle controller 23 is communicatively connected to the engine 12, traction motors 14, 16, vehicle battery system 15, and transmission 18 to control the operation thereof. Controller, control module, module, control unit, processor, and central processing unit, including any permutations thereof, may be used interchangeably to reference suitable computing hardware and attendant logic. These terms may be defined to mean any one or various combinations of one or more of logic circuits, Application Specific Integrated Circuit(s) (ASIC), electronic circuit(s), central processing unit(s) (e.g., microprocessor(s)), and associated memory and storage (e.g., read only, programmable read only, random access, hard drive, tangible, etc.)), combinational logic circuit(s), input/output circuit(s) and devices, etc., whether resident, remote, or a combination of both.

Vehicle controller 23 may be integrated circuit (IC) hardware programmed to execute one or more software or firmware programs or routines, e.g., using appropriate signal conditioning and buffer circuitry, and other components to provide the described functionality. Software, firmware, programs, instructions, routines, code, algorithms and similar terms may be defined to mean any controller-executable instruction sets, including calibrations and look-up tables. A controller may be designed with a set of control routines executed to provide one or more desired functions. Control routines are executed, such as by a central processing unit, and are operable to monitor inputs from sensing devices and other networked control modules, and execute control and diagnostic routines to control operation of devices and actuators. Routines may be executed in real-time, continuously, systematically, sporadically and/or at regular intervals, for example, each 100 microseconds, 3.125, 6.25, 12.5, 25 and 100 milliseconds, etc., during ongoing vehicle use. Alternatively, routines may be executed in response to occurrence of an event during operation of the vehicle 10.

Selectively operable as a continuously variable power transmission, EVT 18 of FIG. 1 includes multiple gear trains, such as a first planetary gear set (PGS) 22, a second PGS 24, and a gear train 44, and helps to define a compound-power-split hybrid powertrain 11 architecture by incorporating a compound planetary gear arrangement 20. This compound planetary gear arrangement 20 is composed of two members of the first PGS 22 being operatively connected to two members of the second PGS 24. First PGS 22 is composed of a ring gear member 28, a planet carrier member 30, and a sun gear member 32. One or more planet gears 29 is/are intermeshed with the ring gear 28 and mounted on the planet carrier member 30, while the sun gear member 32 is intermeshed with the planet gear(s) 29 and concentrically aligned within the ring gear 28. In this regard, the second PGS 24 includes a ring gear member 34, a planet carrier member 36, and a sun gear member 38. One or more planet gears 35 is/are intermeshed with the ring gear 34 and mounted on the planet carrier member 36, while the sun gear member 38 is intermeshed with the planet gear(s) 35 and concentrically aligned within the ring gear 34.

The carrier member 36 of the second gear set 24 is interconnected with the sun gear member 32 of the first gear set 22, e.g., to rotate in unison therewith. The ring gear member 34 of the second gear set 24 is interconnected with the carrier member 30 of the first gear set 22 e.g., to rotate in unison therewith. Finally, the ring gear member 28 of the first gear set 22 is shown interconnected with a transfer gear train 44. The junction points of the EVT 18 are represented by selectable and fixed interconnections such that the resultant structure effectively generates a multi junction point lever when selectable torque transmitting-devices C-0, C-1, C-2, C-3 and C-4 are engaged and disengaged individually and in select combinations.

As portrayed in FIG. 1, the engine 12 and the first motor/generator unit 14, or at least the respective torque-transmitting output shafts thereof, may be disposed for rotation on a common first rotating axis A1. Conversely, the second motor/generator unit 16, or at least the torque-transmitting output shaft thereof, may be disposed for rotation on a second rotating axis A2. According to the illustrated example, the first axis A1 is substantially parallel to the second axis A2. The gear-train 44 of FIG. 1 is configured to operatively connect the second motor/generator unit 16 to the compound planetary gear arrangement 20 at a corresponding junction point. The gear-train 44 may be configured as either a single-stage or a two-stage parallel shaft gear set or as a third PGS.

Engine 12, first MGU 14, and second MGU 16 are operatively connected to the EVT 18 via input member arrangements that transmit torque between the tractive power sources and the compound planetary gear arrangement 20. By way of non-limiting example, the input member arrangement includes: an engine output shaft of the engine 12, which serves as an engine input/output member 46; a rotor of the first MGU 14, which serves as a first motor input/output member 48; and a rotor of the second MGU 16, which serves as a second motor input/output member 50. The engine input/output member 46 provides engine torque to the EVT 18, whereas motor input/output members 48, 50 provide torque from their respective motor/generator units 14, 16 to the EVT 18. A damper assembly 64, which is operatively connected to the input/output shaft 46 of the engine 12, is configured to absorb torsional vibrations generated by the engine 12 before such vibrations can be transmitted to the planetary gear arrangement 20 of EVT 18.

It may be desirable for the first motor input member 48 to be continuously connected or selectively connectable (e.g., via torque transmitting device C-0) to the sun gear member 38. Second motor input member 50 may be continuously connected or selectively connectable (e.g., via torque transmitting device C-4) to the gear train 44. The EVT 18 also includes an output member 52, which may be in the nature of a transmission output shaft, that is continuously connected or selectively connectable to a third junction point. In order to launch and propel the vehicle 10, output member 52 is operable to transmit torque from the compound planetary gear arrangement 20 to a final drive system 13, which is represented herein by differential 17, drive wheels 19 and axle 25. Regenerative braking may be achieved by transferring torque from the final drive system 13, through the output member 52 and EVT 18, to the MGUs 14, 16 when operating in an electric generator mode.

The ICE assembly 12 operates to propel the vehicle 10 independently of the traction motors 14 and 16, e.g., in an "engine-only" operating mode, or in cooperation with either or both motors 14 and 16, e.g., in a "motor-boost" and/or a "motor-launch" operating mode. In the example depicted in FIG. 1, the ICE assembly 12 may be any available or hereafter developed engine, such as a two or four-stroke compression-ignited diesel engine or a four-stroke spark-ignited gasoline or flex-fuel engine, which is readily adapted to provide its available power output typically at a number of revolutions per minute (RPM). Although not explicitly portrayed in FIG. 1, it should be appreciated that the final drive system 13 may take on any available configuration, including front wheel drive (FWD) layouts, rear wheel drive (RWD) layouts, four-wheel drive (4WD) layouts, all-wheel drive (AWD) layouts, etc.

Figure 2:
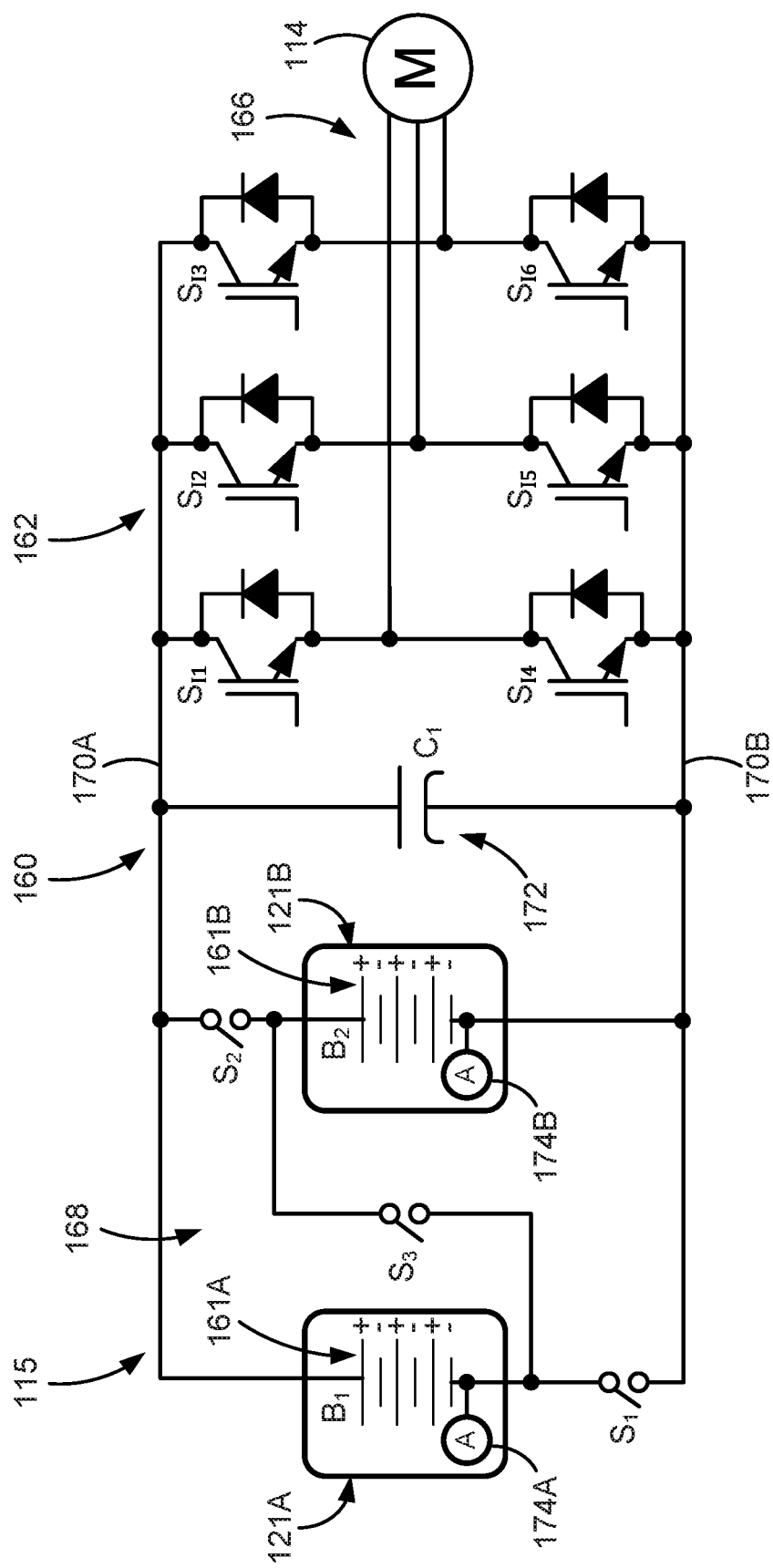
FIG. 2 is a schematic diagram illustrating a representative electric-drive vehicle battery system with multiple traction battery packs and a high-voltage main DC bus with a DC bulk capacitor in accordance with aspects of the present disclosure.

Turning next to FIG. 2, there is shown an onboard rechargeable energy storage system (RESS) 115 that is adapted for storing high-voltage electrical energy used for propelling an electric-drive vehicle, such as hybrid electric vehicle 10 of FIG. 1. RESS 115 may be a deep-cycle, high-ampere capacity battery system rated for approximately 400 to 800 VDC or more, for example, depending on a desired vehicle range, gross vehicle weight, and power ratings of the various loads drawing electrical power from the RESS 115. To this end, the RESS 115 may include multiple high-voltage, independently-rechargeable battery packs 121A and 121B that are selectively electrically connectable to one or more polyphase electric machines, such as three-phase traction motor 114. While only two traction battery packs 121A, 121B and one traction motor 114 are shown in FIG. 2 for illustrative simplicity, a single traction battery pack or three or more traction battery packs may be used within RESS 115 to power any number of electric traction motors.

The first (B1) and second (B2) traction battery packs 121A, 121B may be connected in electrical parallel with respect to a high-voltage main DC bus 160 and a power inverter module 162 for governing the transmission of electrical energy to and from the traction motor 114. Each pack 121A, 121B comes equipped with a respective stack 161A and 161B of battery cells, including lithium ion cells, lithium polymer cells, or any other rechargeable electrochemical cells providing a sufficiently high-power density, as well as any requisite conductive battery support structure and current conditioning hardware. The number and arrangement of battery cells 161A, 161B in each pack 121A, 121B may vary with the intended application of the RESS 115, for instance with 96 or more such cells per pack used in certain high-voltage applications. Although differing in appearance, the RESS 115 of FIG. 2 may include any of the options and features described above with respect to the vehicle battery system 15 of FIG. 1, and vice versa.

A DC-to-AC and AC-to-DC power inverter module 162, which may be part of a transmission power inverter module (TPIM), connects via polyphase windings 166 to traction motor 114 to transmit electrical energy between the motor 114 and battery packs 121A, 121B. The power inverter module 162 may incorporate multiple power inverters and respective motor control modules operable to receive motor control commands and control inverter states therefrom for providing motor drive or regenerative functionality. The power inverter module 162 may comprise a set 164 of semiconductor switches $S_{11}$-$S_{16}$ (also referred to herein as "inverter switches") that cooperatively convert direct current power from the energy storage devices—battery packs 121A, 121B—to alternating current power for powering the electric machine 114 via high-frequency switching. Each semiconductor switch $S_{11}$-$S_{16}$ may be embodied as a voltage-controlled bipolar switching device in the form of insulated gate bipolar transistor (IGBT), metal-oxide semiconductor field effect transistor (MOSFET), wideband GaN device (WBG), or other suitable switch having a corresponding gate to which a gate signal is applied to change the on/off state of a given switch. There is typically at least one semiconductor switch for each phase of a three-phase electric machine.

The traction battery packs 121A, 121B include a set 168 of solid-state relay switches or contactors S1-S3 (also referred to herein as "pack contactor switches") that are independently responsive to signals from a suitable controller or dedicated control module to govern the electrical output of the battery system 115. Contactors/switches S1-S3 are adapted to close under electrical load so as to ensure the instantaneous or near instantaneous delivery of electrical power to the vehicle's propulsion system and to drive any number of in-vehicle accessories. As with the semiconductor inverter switches 164 within the power inverter module 162, pack contactor switches 168 may be constructed of highly efficient switching device, such as wide-gap gallium nitride (GaN) or silicon carbide (SiC) MOSFETs, IGBTs, or other suitable electronic devices. The first pack contactor switch S1 is in electrical series with the first traction battery pack 121A and in electrical parallel with the second traction battery pack 121B. In this regard, second pack contactor switch S2 is in electrical series with the second traction battery pack 121B and in electrical parallel with the first traction battery pack 121A. Contrarywise, third pack contactor switch S3 is in electrical series with both traction battery packs 121A, 121B.

A DC output voltage of the traction battery packs 121A, 121B is delivered across positive and negative voltage bus rails 170A and 170B, respectively, with a fixed-type, high-frequency DC bulk capacitor 172 placed in electrical parallel with both traction battery packs 121A, 121B. The high-frequency DC bulk capacitor 172 is portrayed in FIG. 2 as a single device for ease of illustration. It should be appreciated, however, that the DC bulk capacitor 172 may be composed of multiple capacitor devices that are electrically arranged in series, parallel, or any other suitable electrical configuration to provide electrical capacitance in the electric circuit between the positive and negative conductors of the high-voltage main DC bus 160. An RESS sensing system (not shown) may be arranged to monitor operating parameters of the main DC bus 160 and bulk capacitor 172, such as a bus electrical potential measured across the positive and negative bus rails 170A and 170B of the high-voltage main DC bus 160.

High-frequency DC bulk capacitor 172 is constructed with an interleaved busbar package that helps to reduce parasitic inductance while ensuring the symmetrical distribution of electrical current across the internal capacitor devices, which in turn increases the operational life expectancy of the component. By reducing stray inductance, the bulk capacitor 172 architecture also enables operation of the inverter power stage at high frequencies. As will be described in additional detail below, power loop inductance is reduced by widening and overlapping the bulk capacitor's positive and negative busbars. The DC bulk capacitor 172 is also provided with internal structure that physically supports, retains, and provides high-voltage isolation for the internal capacitor devices. The overall bulk capacitor package is modular and, thus, can be easily scaled to functionally connect 2, 4, 6, 8, 10, or more capacitor bobbins. The bulk capacitor 172 helps to ameliorate: (1) ripple current due to inverter switching; (2) voltage fluctuation due to the source lead inductance; (3) voltage transients due to leakage inductance and fast device switching; and (4) over voltage due to regeneration. What's more, resonances are eliminated from the input impedance of the bulk capacitor using disclosed interleaved busbar designs.

Capacitor size of the DC bulk capacitor 172 may be described in terms of its total capacitance, and may be selected based upon any number of variables, including expected voltage range, peak current, and ripple voltage amplitude across the main DC bus 160. In this regard, capacitance of a bulk capacitor may also be determined in relation to parameters such as peak voltage, root mean square (RMS) current, minimum and maximum bus current levels, operating temperatures, and other factors. As such, the size of the DC bulk capacitor 172, in terms of its total capacitance, may be selected based upon expected DC bus voltage ripple when operating the power inverter module 162 employing, for example, a six-step mode of operation. As yet another option, the DC bulk capacitor 172 may take on the form of any suitable electrical capacitive storage device, be it electrolytic devices, aluminum devices, ceramic devices, plastic capacitance devices, wound film devices, etc. Furthermore, the conductive material employed by each capacitor device may comprise any suitable electrically conductive material, such as aluminum, copper, gold, zinc, or an alloy or composite of the foregoing metallic materials.

Figure 3:
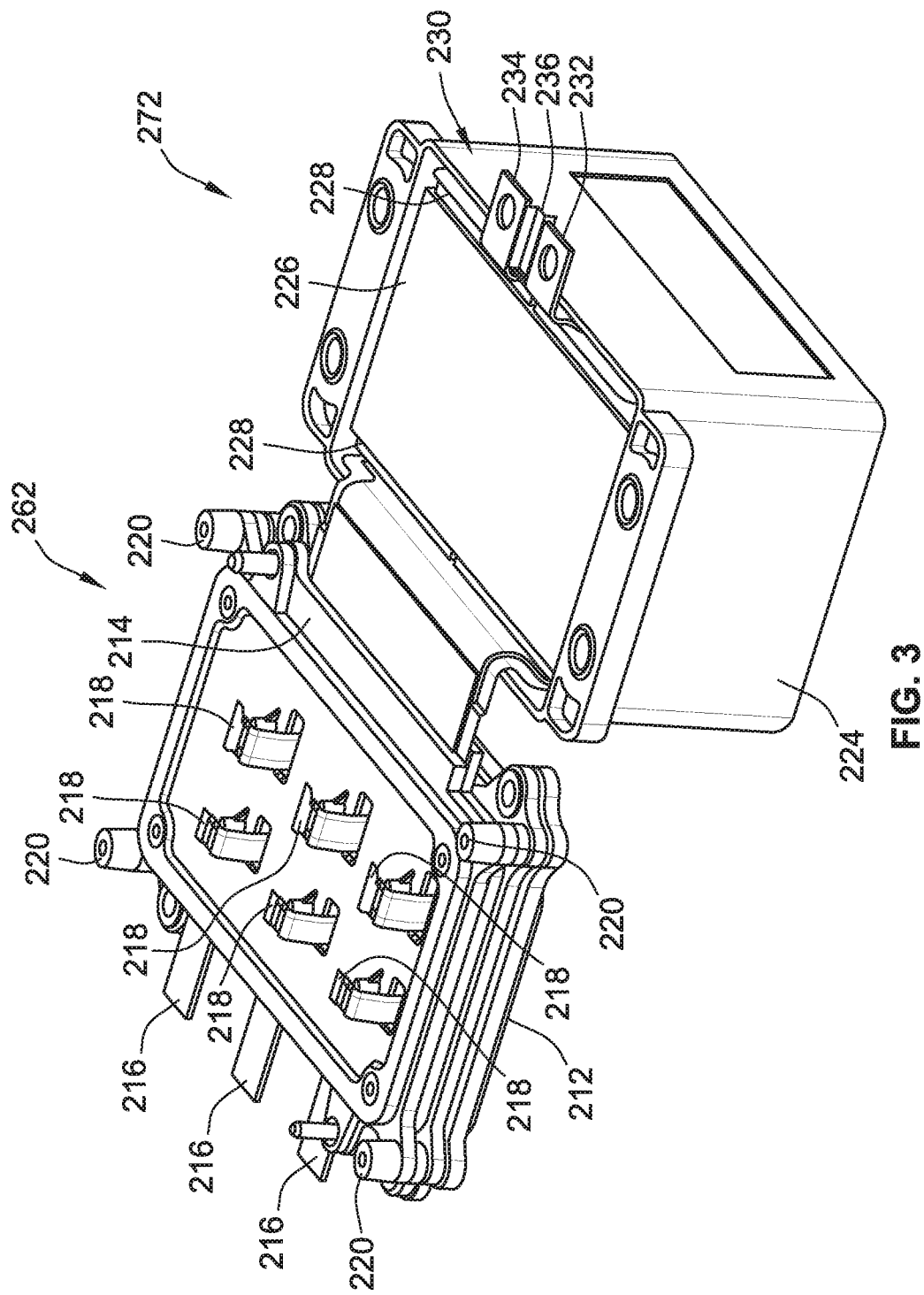
FIG. 3 is a perspective-view illustration of a representative power inverter module laser welded to a representative high-frequency DC bulk capacitor with interleaved busbar package in accordance with aspects of the present disclosure.

FIG. 3 presents a representative high-frequency DC bulk capacitor 272 that is electrically connected to a representative power inverter module 262 for maintaining high-current, high-frequency power transmission with smoothed bus voltage. As indicated above, the power inverter module 262 and bulk capacitor 272 may be incorporated into the representative applications of FIGS. 1 and 2 and, thus, can include any of the corresponding options and features associated with the vehicle 10 and RESS 115 (and vice versa). Power inverter module 262 is generally composed of an electrically conductive base plate 212, an electrically insulative PIM housing 214, three conductive PIM tabs 216, six semiconductor switches 218, and a control resistor board (not visible in the view provided). Base plate 212 may be fabricated as a solid slab of conductive material, such as copper or aluminum, without any electrically or thermally insulative material. Antithetically, the PIM housing 214 is fabricated from an insulative material, such as a plastic, epoxy, and/or epoxy-impregnated fiber glass. The PIM housing 214 may be rigidly coupled to the base plate 212 using, for example, threaded fasteners 220. The semiconductor switches 218 may be mounted to the PIM housing 214, e.g., as unpacked or "bare" dice in a 3×2 matrix. An active (drain) terminal of each switch 218 is electrically connected to the base plate 212 while an active (source) terminal is electrically connected to the conductive PIM tabs 216.

Figure 4:
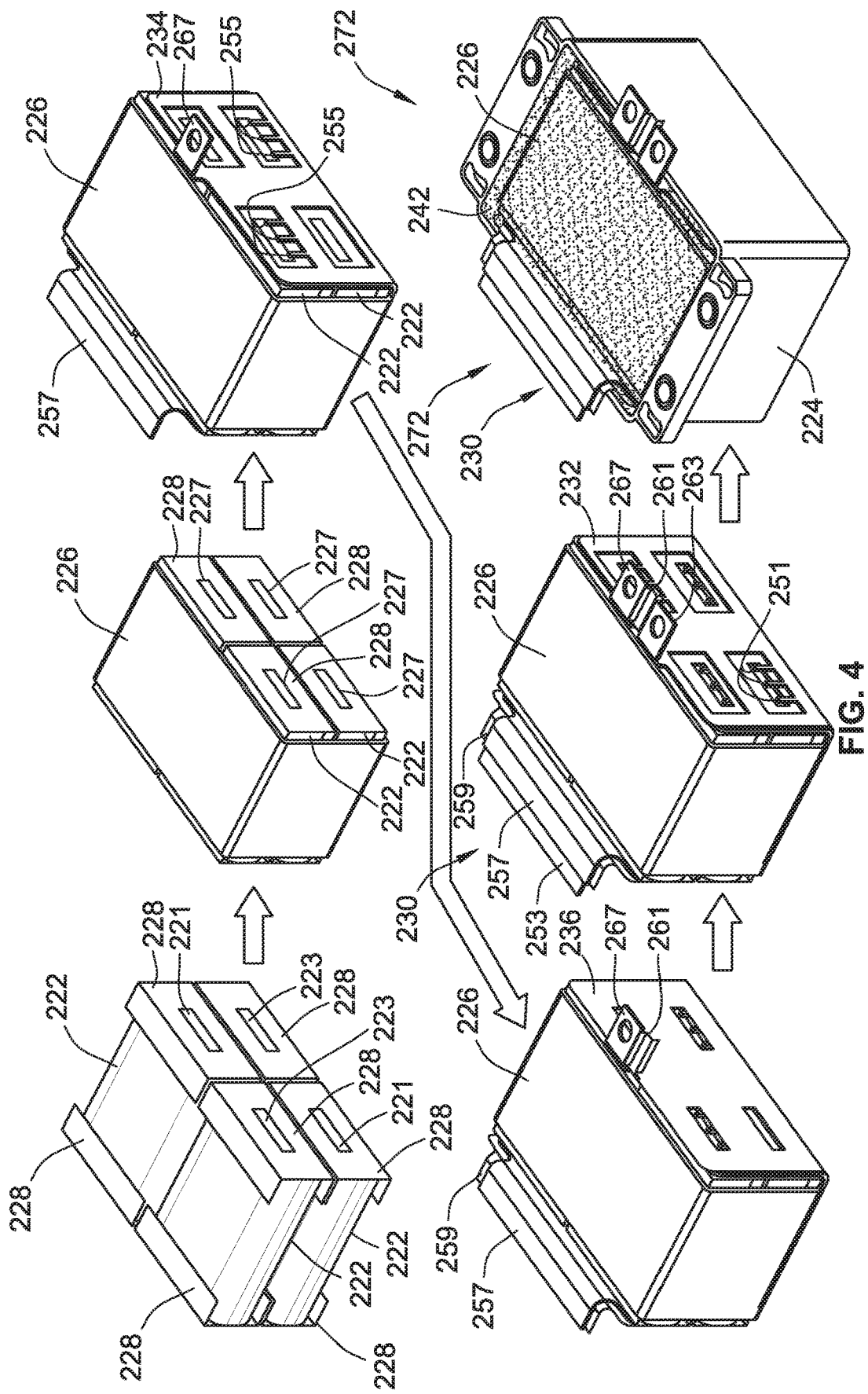
FIG. 4 is a workflow diagram illustrating a representative manufacturing method for constructing the bulk capacitor of FIG. 3.

With collective reference to FIGS. 3 and 4, bulk capacitor 272 contains, among other things, a bank of four (4) conduction-cooled or immersion-cooled, wound film capacitors 222 that are mounted within a hermetically sealable, box-shaped outer housing 224. These wound film capacitors 222 (or "capacitor devices") help to protect the semiconductor switches 218 from repetitive transient voltages arising during the normal course of operation of the power inverter module 262. In accord with the illustrated example, the capacitor devices 222 provide bulk filtering to attenuate attendant voltage fluctuations associated with a ripple current across a high-voltage bus, such as main DC bus 160 of FIG. 2. Each capacitor device 222 within the bank of capacitors defines a single capacitive cell with negative and positive terminals 221 and 223, respectively. Those skilled in the art will recognize that, although the terminals 221, 223 are referred to herein as positive and negative, bulk film capacitors are typically not polarized. Capacitor devices 222 each constitutes a capacitive element, which may comprise alternating layers of metallized foil and insulative dielectric film that are spirally wound about a thermally conductive, tubular bobbin. An insulation lining jacket 226 is shown wrapped around an outer perimeter of the stacked array of capacitor devices 222. In addition, an isolation endcap 228 is mounted on and electrically insulates a respective longitudinal end of each capacitor device 222. Lining jacket 226 and endcaps 228 may be formed from any suitable electrically insulating material, including polypropylene, polytetrafluoroethylene, polyimide, and polyester, as well as the other insulative materials described above.

Interposed between the capacitor devices 222 and the bulk capacitor's outer housing 224 is an interleaved busbar package, designated generally as 230 in the Figures. For at least some implementations, it may be desirable that the interleaved busbar package 230 is a tripartite unit that consists essentially of a first (negative) busbar plate 232, a second (positive) busbar plate 234, and an isolator (barrier) sheet 236 interleaved between the two busbar plates 232, 234. The components of the interleaved busbar package 230 may each be fabricated as a discrete, single-piece structure; the three pieces are subsequently assembled into the final busbar package 230, as best seen with respect to the workflow diagram of FIG. 4 and the exploded view of FIG. 5. The first busbar plate 232 may be cut and stamped from metallic sheet stock and thereafter electrically connected to first (negative) terminals 221 of the four capacitor devices 222. In the same vein, the second busbar plate 234 may be cut and stamped from metallic sheet stock and then electrically connected to second (positive) terminals 223 of the four capacitor devices 222. It should be appreciated that use of the first busbar plate 232 as a negative busbar connector and the second busbar plate 234 as a positive busbar connector is application-specific and, thus, may be interchanged for other implementations. The isolator sheet 236 may be cut from insulative paper sheet stock to electrically isolate the first busbar plate 232 from second busbar plate 234. The shapes, sizes, materials, and manufacturing methods may be varied from that which are shown in the drawings and discussed above.

Figure 5:
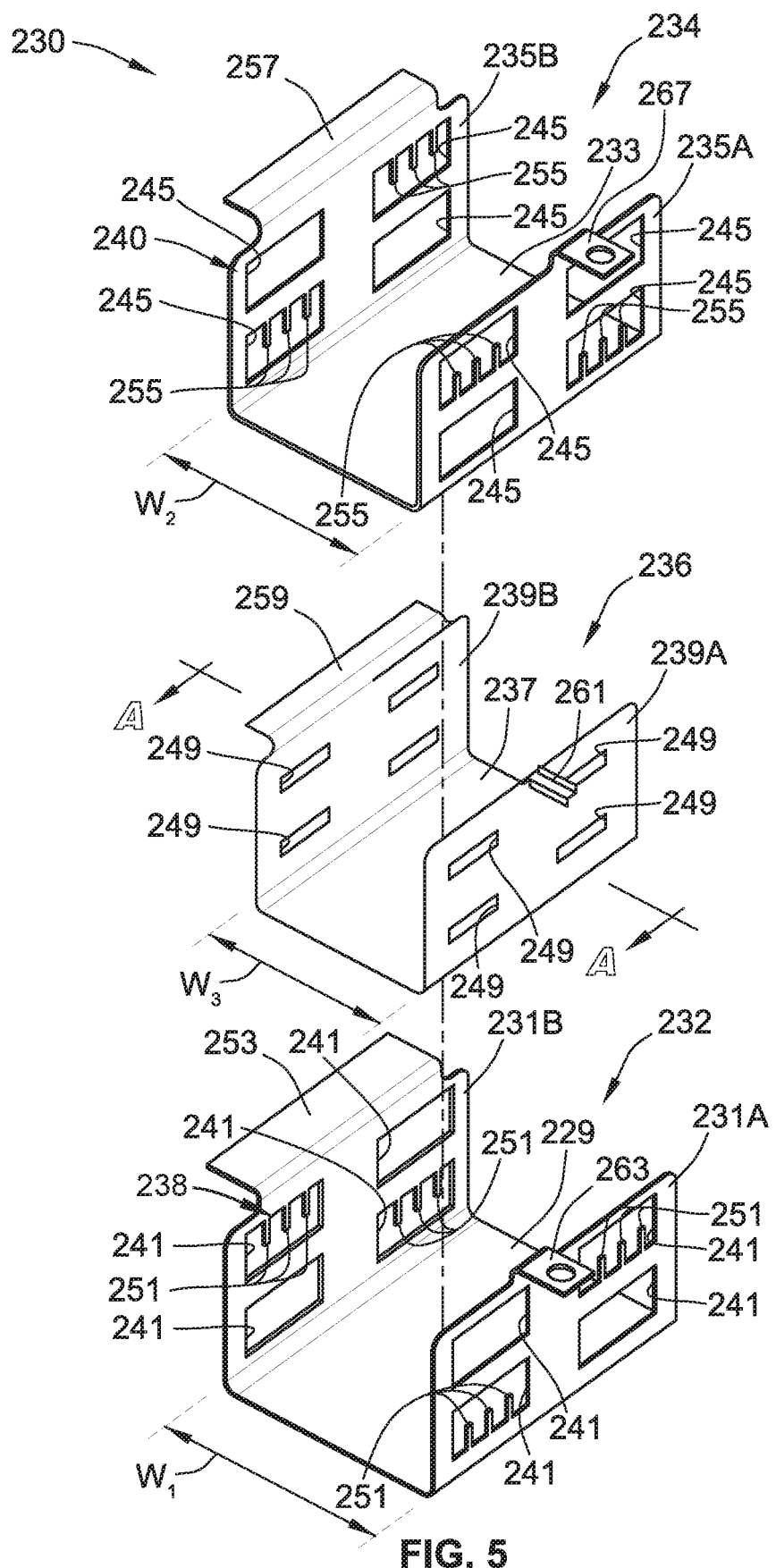
FIG. 5 is an exploded, perspective-view illustration of the representative interleaved busbar package of FIG. 3.

Referring next to FIG. 5, the three constituent parts of the interleaved busbar package 230 may have complementary geometries that allow the components to stack one inside the other in a layered fashion. For instance, the first busbar plate 232 has a distinct (first) U-shaped cross-section that is generally typified by a pair of (first) planar sidewalls 231A and 231B that adjoin and project generally orthogonally from opposite sides of an intermediate (first) planar base 229. Along these lines, the second busbar plate 234 has a distinct (second) U-shaped cross-section that may be generally typified by a pair of (second) planar sidewalls 235A and 235B that adjoin and project generally orthogonally from opposite sides of an intermediate (first) planar base 233. A "U-shaped cross-section", as used herein, may be characterized as a two-dimensional orthographic projection taken by cutting each part down the center along a transverse vertical plane that extends from left-to-right along section line A-A in FIG. 5. The representative busbar plate cross-sections are distinct in that the sidewall-to-sidewall width $W_2$ of the second busbar plate's U-shaped cross-section is narrower than the sidewall-to-sidewall width $W_1$ of the first busbar plate's U-shaped cross-section. In so doing, the second busbar plate 234 nests within a 3-sided busbar pocket 238 defined by the sidewalls 231A, 231B and base 229 of the first busbar plate 232. Once fit compactly together, the horizontal base 229 of the first busbar plate 232 is substantially parallel with the horizontal base 233 of the second busbar plate 234, and the vertical sidewalls 231A, 231B, 235A, 235B are mutually parallel.

Isolator sheet 236 is also fashioned with a complementary shape that allows it to fit inside the busbar plate's pocket 238, sandwiched between the two busbar plates 232, 234. By way of non-limiting example, isolator sheet 236 has a distinct (third) U-shaped cross-section that is generally typified by a pair of (third) planar sidewalls 239A and 239B that adjoin and project generally orthogonally from opposite sides of an intermediate (third) planar base 237. The sidewall-to-sidewall width $W_3$ of the isolator sheet 236 is slightly narrower than the width $W_1$ of the U-shaped cross-section of the first busbar plate 232 yet slightly wider than the width $W_2$ of the U-shaped cross-section of the second busbar plate 234. This allows the isolator sheet 236 to insert between the two busbar plates 232, 234, with opposing sides of the isolator sheet base 237 laying substantially flush against the busbar plate bases 229, 233, and opposing sides of each isolator sheet sidewall 239A, 239B laying substantially flush against respective busbar plate sidewalls 231A, 235A and 231B, 235B, respectively. After fully assembling the interleaved busbar package 230, the "capped and wrapped" array of capacitor devices 222 rigidly mount inside a 3-sided capacitor basin 240 defined by the second busbar plate 234. The busbar package 230 therefore acts as a divider that spaces the capacitor devices 222 from inner surfaces of the bulk capacitor's outer housing 224. Any remaining gaps between the housing 224 and capacitor devices 222 may be filled with an epoxy endfill composition 242.

Interleaved busbar package 230 provides local high-current power distribution to and from the capacitor devices 222. The first busbar plate 232 is fabricated with multiple (first) windows: busbar plate 232 is shown with a total of eight (8) windows 241 in FIG. 5, four (4) of which are arranged in a 2×2 matrix punched or laser cut through each sidewall 231A, 231B. Along those lines, the second busbar plate 234 is also fabricated with multiple (second) windows: busbar plate 234 is shown with a total of eight (8) windows 245 in FIG. 5, with four (4) windows 245 arranged in a 2×2 matrix punched or laser cut through each sidewall 235A, 235B. Likewise, the isolator sheet 236 is fabricated with multiple (third) windows: isolator sheet 236 is shown with eight (8) windows 249 in FIG. 5, with four (4) windows 249 arranged in a 2×2 matrix extending through each sidewall 239A, 239B. While any functionally suitable shape may be implemented, the representative windows 241, 245, 249 all have rectangular shapes, with the first windows 241 being larger than the second and third windows 245, 249, and the third windows 249 being the smallest of the windows 241, 245, 249. When the interleaved busbar package 230 is assembled, each of the first windows 241 aligns with a second and a third window 245, 249 such that all three aligned windows 241, 245, 249 line up with a longitudinal end of a capacitor device 222. Each endcap 228 is also provided with a window 227 (FIG. 4) that forms an unobstructed path to a longitudinal end of a capacitor device 222.

For each sidewall 231A, 231B and 235A, 235B of the first and second busbar plates 232, 234, a subset of the corresponding windows 241, 245 is provided with electrical connectors for electrically coupling that busbar plate 232, 234 to the capacitor devices 222. According to the illustrated example presented in FIGS. 4 and 5, two of the four windows 241 in each sidewall 231A, 231B—one diagonally offset from the other—each has three (3) elongated (first) electrical fingers 251 projecting into that window 241. Likewise, two of the four windows 245 in each sidewall 235A, 235B—one diagonally offset from the other—each has three (3) elongated (second) electrical finger 255 projecting into that window 245. Each finger 251, 255 is electrically connected, e.g., via soldering, fusing, welding, or other suitable means to one of the terminals 221, 223 of the capacitor devices 222. Electrical fingers 251 of the first busbar plate 232 may be arranged in opposite windows to that of the electrical fingers 255 of the second busbar plate 234. The bottom center view of the DC bulk capacitor 272 in FIG. 4 shows that, once the capacitor 272 is fully assembled, the first busbar plate's fingers 251 are located in the upper-right and bottom-left windows 241, whereas the second busbar plate's fingers 255 are located in the upper-left and bottom-right windows 245. Although shown with three rectangular fingers 251, 255, the subset of windows 241, 245 may be provided with greater or fewer than three electrical connectors of varying shapes and orientations.

A rectangular (first) connector pad 253 is integrally formed with and projects generally orthogonally from one sidewall 231B of the first busbar plate 232. This connector pad 253 electrically connects, e.g., via laser welding, to the power inverter module 262 and, through there, an electrical load, such as MGUs 14 and 16 of FIG. 1 or traction motor 114 of FIG. 2. A square-shaped (first) connector tab 263 is integrally formed with and projects generally orthogonally from the other sidewall 231A of busbar plate 232. Connector tab 263 electrically connects the DC bulk capacitor 272, e.g., via conductive bolts, to a power source, such as traction battery packs 21A, 21B of FIG. 1 or traction battery packs 121A, 121B of FIG. 2. Furthermore, a rectangular (second) connector pad 257 is integrally formed with and projects generally orthogonally from one sidewall 235B of the second busbar plate 234. Like connector pad 253, connector pad 257 electrically connects, e.g., via laser welding, to the power inverter module 262 and, thus, a traction motor. A square-shaped (second) connector tab 267 is integrally formed with and projects generally orthogonally from the other sidewall 235BA of busbar plate 234. Like the first busbar's connector tab 263, connector tab 267 electrically connects the DC bulk capacitor 272 to a power source.

With continuing reference to FIGS. 3-5, the isolator sheet 236 electrically insulates the electrical connection points of the first and second busbar plates 232, 234. For instance, the isolator sheet 236 is fabricated with a rectangular pad isolator 259 that is integrally formed with and projects generally orthogonally from sidewall 239B. As the name implies, pad isolator 259 lays between and physically separates the first and second connector pads 253, 257. Furthermore, a generally Z-shaped tab isolator 261 is integrally formed with and projects generally orthogonally from sidewall 239A. Tab isolator 261 is interposed between and physically separates the two connector tabs 263, 267.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A bulk capacitor, comprising:
   an outer housing;
   a plurality of capacitor devices disposed within the outer housing and operable to modify an electric current transmitted between a power source and an electrical load, the capacitor devices being grouped into a stack of the capacitor devices;
   a lining jacket wrapped around and electrically insulating an outer perimeter of the stack of the capacitor devices;
   a plurality of isolation endcaps mounted on and electrically insulating longitudinal ends of the capacitor devices; and
   an interleaved busbar package interposed between the capacitor devices and the outer housing, the interleaved busbar package including:
      a first busbar plate electrically connected to first terminals of the capacitor devices and defining a busbar pocket;
      a second busbar plate seated within the busbar pocket and electrically connected to second terminals of the capacitor devices, the second busbar plate defining a capacitor basin seating therein the capacitor devices; and
      an isolator sheet interleaved between the first and second busbar plates and electrically insulating the first busbar plate from the second busbar plate.

2. The bulk capacitor of claim 1, wherein the first busbar plate has a first U-shaped cross-section, and the second busbar plate has a second U-shaped cross-section narrower than the first U-shaped cross-section.

3. The bulk capacitor of claim 2, wherein the first U-shaped cross-section has a pair of first sidewalls connected via a first base, and the second U-shaped cross-section has a pair of second sidewalls connected via a second base, the second base being substantially parallel with the first base, and the second sidewalls being substantially parallel with the first sidewalls.

4. The bulk capacitor of claim 3, wherein the isolator sheet has a third U-shaped cross-section narrower than the first U-shaped cross-section and wider than the second U-shaped cross-section.

5. The bulk capacitor of claim 4, wherein the third U-shaped cross-section has a pair of third sidewalls connected via a third base, the third base laying substantially flush against the first and second bases, and the third sidewalls each laying substantially flush against a respective one of the first sidewalls and a respective one of the second sidewalls.

6. The bulk capacitor of claim 1, wherein the first busbar plate has a pair of first sidewalls connected via a first base, and multiple first windows extending through each of the first sidewalls, the first windows being aligned with the longitudinal ends of the capacitor devices.

7. The bulk capacitor of claim 6, wherein the first busbar plate further includes multiple first electrical fingers projecting into each window of a subset of the first windows and electrically connecting to the first terminals of the capacitor devices.

8. The bulk capacitor of claim 7, wherein the first busbar plate further includes a first connector pad projecting from one of the first sidewalls and configured to electrically connect, directly or indirectly, to the electrical load, and a first connector tab projecting from another of the first sidewalls and configured to electrically connect, directly or indirectly, to the power source.

9. The bulk capacitor of claim 8, wherein the second busbar plate has a pair of second sidewalls connected via a second base, and multiple second windows extending through each of the second sidewalls, the second windows being aligned with the first windows and with the longitudinal ends of the capacitor devices.

10. The bulk capacitor of claim 9, wherein the second busbar plate further includes multiple second electrical fingers projecting into each window of a subset of the second windows and electrically connecting to the second terminals of the capacitor devices.

11. The bulk capacitor of claim 10, wherein the second busbar plate further includes a second connector pad projecting from one of the second sidewalls and configured to electrically connect, directly or indirectly, to the electrical load, and a second connector tab projecting from another of the second sidewalls and configured to electrically connect, directly or indirectly, to the power source.

12. The bulk capacitor of claim 11, wherein the isolator sheet further includes a pair of third sidewalls connected via a third base, a pad isolator projecting from one of the third sidewalls and interleaved between the first and second connector pads, and a tab isolator projecting from another of the third sidewalls and interposed between the first and second connector tabs.

13. The bulk capacitor of claim 12, wherein the isolator sheet further includes multiple third windows extending through each of the third sidewalls, the third windows being aligned with the first and second windows and with the longitudinal ends of the capacitor devices.

14. The bulk capacitor of claim 1, wherein the stack of the capacitor devices are arranged in an array of rows and columns, the bulk capacitor further comprising an epoxy endfill composition submerging the capacitor devices in the outer housing.

15. An electric-drive vehicle comprising:
   a vehicle body with a plurality of road wheels;
   a traction motor attached to the vehicle body and configured to drive one or more of the road wheels to thereby propel the electric-drive vehicle;
   a traction battery pack attached to the vehicle body and configured to transmit an electric current with the traction motor; and
   a bulk capacitor including:
      an outer housing attached to the vehicle body;
      a plurality of capacitor devices grouped into a stack of the capacitor devices, disposed within the outer housing, and operable to modify the electric current transmitted between the traction battery pack and the traction motor;
      a lining jacket wrapped around and electrically insulating an outer perimeter of the stack of the capacitor devices;
      a plurality of isolation endcaps mounted on and electrically insulating longitudinal ends of the capacitor devices; and
      an interleaved busbar package placed between the capacitor devices and the outer housing, the interleaved busbar package including a first busbar plate electrically connected to first terminals of the capacitor devices and defining a busbar pocket, a second busbar plate seated within the busbar pocket and electrically connected to second terminals of the capacitor devices, the second busbar plate defining a capacitor basin seating therein the capacitor devices, and an isolator sheet interleaved between the first and second busbar plates and electrically insulating the first busbar plate from the second busbar plate.

16. A method of assembling a bulk capacitor, the method comprising:
placing a plurality of capacitor devices within an outer housing, the capacitor devices being grouped into a stack of the capacitor devices and operable to modify an electric current transmitted between a power source and an electrical load;
wrapping an electrically insulating lining jacket around an outer perimeter of the stack of the capacitor devices;
mounting a plurality of electrically insulating isolation endcaps onto longitudinal ends of the capacitor devices; and
positioning an interleaved busbar package between the capacitor devices and the outer housing, the positioning of the interleaved busbar package including:
electrically connecting a first busbar plate to first terminals of the capacitor devices, the first busbar plate defining a busbar pocket;
electrically connecting a second busbar plate to second terminals of the capacitor devices, the second busbar plate being seated within the busbar pocket and defining a capacitor basin seating therein the capacitor devices; and
interleaving an isolator sheet between the first and second busbar plates to thereby electrically insulate the first busbar plate from the second busbar plate.

17. The method of claim 16, wherein the first busbar plate has a first U-shaped cross-section, the second busbar plate has a second U-shaped cross-section narrower than the first U-shaped cross-section, and the isolator sheet has a third U-shaped cross-section narrower than the first U-shaped cross-section and wider than the second U-shaped cross-section.

18. The method of claim 17, wherein the first U-shaped cross-section has a pair of first sidewalls connected via a first base, and the second U-shaped cross-section has a pair of second sidewalls connected via a second base, the second base being substantially parallel with the first base, and the second sidewalls being substantially parallel with the first sidewalls.

19. The method of claim 18, wherein the third U-shaped cross-section has a pair of third sidewalls connected via a third base, the third base laying substantially flush against the first and second bases, and the third sidewalls each laying substantially flush against a respective one of the first sidewalls and a respective one of the second sidewalls.

20. The method of claim 19, wherein:
the first busbar plate has multiple first windows extending through each of the first sidewalls;
the second busbar plate has multiple second windows extending through each of the second sidewalls; and
the isolator sheet has multiple third windows extending through each of the third sidewalls, the first, second, and third windows being aligned with each other and with the longitudinal ends of the capacitor devices.

* * * * *